US009735317B2

(12) United States Patent
Reboud et al.

(10) Patent No.: US 9,735,317 B2
(45) Date of Patent: Aug. 15, 2017

(54) METHOD FOR FORMING A SEMICONDUCTING PORTION BY EPITAXIAL GROWTH ON A STRAINED PORTION

(71) Applicant: Commissariat a l'energie atomique et aux energies alternatives, Paris (FR)

(72) Inventors: Vincent Reboud, Paris (FR); Alban Gassenq, Saint-Hilaire (FR); Kevin Guilloy, Grenoble (FR); Vincent Calvo, Fontaine (FR); Alexei Tchelnokov, Meylan (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/281,738

(22) Filed: Sep. 30, 2016

(65) Prior Publication Data
US 2017/0092809 A1 Mar. 30, 2017

(30) Foreign Application Priority Data

Sep. 30, 2015 (FR) ..................... 15 59284

(51) Int. Cl.
*H01L 21/70* (2006.01)
*H01L 21/02* (2006.01)
(Continued)

(52) U.S. Cl.
CPC .......... *H01L 33/26* (2013.01); *H01L 21/0245* (2013.01); *H01L 21/02381* (2013.01);
(Continued)

(58) Field of Classification Search
CPC ......... H01L 33/28; H01L 33/26; H01L 33/20; H01L 33/105; H01L 33/0095;
(Continued)

(56) References Cited

U.S. PATENT DOCUMENTS 7,759,233 B2 * 7/2010 Forbes .................. H01L 29/045
438/584
8,039,370 B2 * 10/2011 Bordel ................ H01L 21/2007
257/E33.025
(Continued)

FOREIGN PATENT DOCUMENTS

WO WO 03/045837 A2 6/2003

OTHER PUBLICATIONS

J. Widiez, et al., "SOI-type Bonded Structures for Advanced Technology Nodes", ECS Transactions, 2014, 14 pgs.
(Continued)

*Primary Examiner* — Marvin Payen
*Assistant Examiner* — Jeremy Joy
(74) *Attorney, Agent, or Firm* — Oblon, McClelland, Maier & Neustadt, L.L.P.

(57) ABSTRACT

The invention pertains to formation of a semiconducting portion (60) by epitaxial growth on a strained germination portion (40), comprising the steps in which a cavity (21) is produced under a structured part (11) by rendering free a support layer (30) situated facing the structured part (11), a central portion (40), termed the strained germination portion, then being strained; and a semiconducting portion (60) is formed by epitaxial growth on the strained germination portion (40), wherein the structured part (11) is furthermore placed in contact with the support layer (30) in such a way as to bind the structured part (11) of the support layer.

15 Claims, 6 Drawing Sheets (51) Int. Cl.

| | | |
|---|---|---|
| *H01L 33/00* | (2010.01) | |
| *H01L 33/26* | (2010.01) | |
| *H01L 33/20* | (2010.01) | |
| *H01L 21/8238* | (2006.01) | |
| *H01L 33/10* | (2010.01) | |
| *H01L 29/10* | (2006.01) | |
| *H01L 21/8234* | (2006.01) | |
| *H01L 29/78* | (2006.01) | |

(52) U.S. Cl.
CPC ............... *H01L 21/02532* (2013.01); *H01L 21/823412* (2013.01); *H01L 21/823807* (2013.01); *H01L 29/1054* (2013.01); *H01L 29/7842* (2013.01); *H01L 33/0012* (2013.01); *H01L 33/0054* (2013.01); *H01L 33/0095* (2013.01); *H01L 33/105* (2013.01); *H01L 33/20* (2013.01); *H01L 2924/01032* (2013.01); *H01L 2924/3511* (2013.01); *H01L 2933/0033* (2013.01)

(58) Field of Classification Search
CPC ............ H01L 33/0054; H01L 33/0012; H01L 21/823807; H01L 21/02532; H01L 21/02381; H01L 21/0245; H01L 21/823412; H01L 29/7842; H01L 29/1054; H01L 2924/3511; H01L 2924/01032; H01S 5/3201; H01S 5/3223
See application file for complete search history.

(56) References Cited

U.S. PATENT DOCUMENTS

| | | | | |
|---|---|---|---|---|
| 2003/0168659 A1* | 9/2003 | Lal | ................... | B81C 1/00666 257/49 |
| 2004/0173798 A1* | 9/2004 | Forbes | ............... | H01L 21/0262 257/69 |
| 2004/0224480 A1* | 11/2004 | Forbes | .............. | H01L 21/76254 438/455 |
| 2006/0094175 A1* | 5/2006 | Cohen | .................... | H01L 24/26 438/190 |
| 2006/0134893 A1* | 6/2006 | Savage | .............. | H01L 21/6835 438/483 |
| 2008/0029832 A1* | 2/2008 | Forbes | ............ | H01L 21/823807 257/408 |
| 2011/0059598 A1* | 3/2011 | Saracco | ................. | B82Y 10/00 438/479 |

OTHER PUBLICATIONS

S, Wirths, et al., "Lasing in direct-bandgap GeSn Alloy grown on Si", Nature Photonics, 2015, 5 pgs.
J. M. Hartmann, et al., "Critical thickness for plastic relaxation of SiGe on Si(001) revisited", Journal of Applied Physics 110, 2011, 8 pgs.
French Preliminary Search Report issued Mar. 3, 2016 (with Written Opinion) in French Application 15 59284 filed on Sep. 30, 2015 (with English Translation of Categories of Cited Documents).
J. F. Damlencourt, et al., "High-quality fully relaxed In0.65Ga0.35As layers grown on InP using the paramorphic approach", Applied Physics Letters, vol. 75, (23), 1999, 3 pgs.
Mouloud Boudaa, et al., Growth and Characterization of Totally Relaxed InGaAs Thick Layers on Strain-Relaxed Paramorphic InP Substrates, Journal of Electronic Materials, vol. 33, 7, 2004, 7 pgs.
G.M. Cohen, et al., "Dislocation-free strained silicon-on-silicon by in-place bonding", Applied Physics Letters, (86), 2005, 3 pgs.
J. W. Matthews, et al., "Defects in Epitaxial Multilayers", Journal of Crystal Growth 27, 1974, 8 pgs.
P.M.J. Maree, et al., "Generation of misfit dislocations in semiconductors", Journal of Applied Physics, 1987, 9 pgs.
C.K. Maiti, et al., "Strained silicon heterostructures: materials and devices"—(IEE circuits, devices and systems series; No. 12), The Institute of Electrical Engineers, London, UK, 2001, https://books.google.fr/books?id=3_QFhDSKE6sC&pg=PA18&lpg=PA18&dq=Strained+silicon+heterostructures:+materials+and+devices&source=bl&ots=k4kqNLXPCK&sig=FH_cQspMzqP6nOS_S7Rsu09NBg0&hl=fr&sa=X&ei=E1FfVd3yPIXwUMzAgbgN&ved=0CD4Q6AEwAw#v=onepage&q=Strained%20silicon%20heterostructures%3A%20materials%20and%20devices&f=false.
S. Takagi, "Strained-si CMOS Technology", 2007, 20 pgs.
Minjoo L. Lee, et al., "Strained Si, SiGe, and Ge channels for high-mobility metal-oxide-semiconductor field-effect transistors", Journal of Applied Physics 97, 2005, 28 pgs.
T. Mizuno, et al., "Electron and Hole Mobility Enhancement in Strained-Si MOSFET's on SiGe-on-Insulator Substrates Fabricated by SIMOX Technology", IEEE Electron Device Letters, vol. 21, (5), 2000, 3 pgs.
S. Takagi, et al., "Channel Structure Design, Fabrication and Carrier Transport Properties of Strained-Si/SiGe-On-Insulator (Strained-SOI) MOSFETs", IEEE, 2003, 4 pgs.
T.A. Langdo, et al., "SiGe-free strained Si on insulator by wafer bonding and layer transfer", Applied Physics Letters, vol. 82, (24), 2003, 3 pgs.
K. Rim, et al., "Fabrication and Mobility Characteristics of Ultra-thin Strained Si Directly on Insulator (SSDOI) MOSFETs", IEEE, 2003, 4 pgs.

\* cited by examiner

METHOD FOR FORMING A SEMICONDUCTING PORTION BY EPITAXIAL GROWTH ON A STRAINED PORTION

TECHNICAL FIELD

The field of the invention is that of the epitaxial growth of a semiconducting portion on a strained germination portion resting on a support layer. The invention applies in particular to the production of a microelectronic or optoelectronic device comprising such a semiconducting portion whose crystallographic structure advantageously exhibits no or few structural defects.

STATE OF THE PRIOR ART

In diverse microelectronic or optoelectronic applications, it may be advantageous to use a semiconducting layer made of a strained crystalline material. Such is the case in particular in respect of high-performance transistors where the strain undergone by the material can be manifested by an increase in the speed of displacement of the charge carriers, thus improving the performance of the transistor. Such is the case also in respect of certain light sources, the material of whose emissive layer or gain medium exhibits, unstrained, an indirect energy band structure, the band structure then being rendered substantially direct by the application of an appropriate strain.

It can also be advantageous to form a layer or a portion of semiconducting layer by epitaxial growth on a strained layer such as this, the latter then being suitable for growing the layer to be epitaxied. The difficulty then generally arises of a possible cell mismatch between the germination/support layer and the epitaxial layer, which may perhaps manifest itself through the appearance of structural defects at the interface between the layers, which defects are liable to degrade the electronic and/or optical properties of the epitaxied layer. Cell mismatch is understood as the relative difference between the lattice constant $a_c$ of the material to be epitaxied and that $a_g$ of the germination layer, and can be expressed by the parameter $\Delta a/a=(a_c-a_g)/a_c$. The epitaxial layer grows with a lattice constant substantially equal to that of the germination layer but undergoes a deformation of its crystallographic structure which is manifested by the generation of mechanical strains, in particular compressive or tensile. Onward of a so-called critical thickness, the strains undergone by the epitaxial layer can relax and cause the appearance of structural defects, for example so-called cell mismatch dislocations, localized at the interface with the germination layer, thus giving rise to a degradation of the electronic and/or optical properties of the epitaxied layer.

Also, the epitaxial growth of a semiconducting layer on a strained germination layer can make it possible to modify or indeed control the cell mismatch. Document WO03/045837 describes an exemplary method for forming a semiconducting portion by epitaxy on a strained germination portion. A stack of a germination layer, made for example of silicon, tied to a support layer by way of an inserted sacrificial layer, is produced firstly. The germination layer is structured in such a way as to form a germination portion linked to a peripheral part. The germination portion is thereafter suspended above a cavity formed by etching of the subjacent sacrificial layer, and is then put under strain by the deposition of a suitable material on either side of the germination portion. A semiconducting portion, made for example of germanium silicon or of III-V materials, is thereafter formed by epitaxy on the basis of the strained germination portion. It is thus possible, for example, to modify the composition in the epitaxied portion of germanium silicon as a function of the strain undergone by the germination portion.

However, a need exists to obtain a semiconducting structure comprising a semiconducting portion epitaxied on a strained germination portion, which can support conventional subsequent microelectronics steps, such as steps of layer deposition, of lithography and of etching, or indeed of doping, as a function of the microelectronic or optoelectronic applications envisaged.

DISCLOSURE OF THE INVENTION

The objective of the invention is to remedy at least in part the drawbacks of the prior art, and more particularly to propose a method for forming a semiconducting portion by epitaxial growth on a strained germination portion. Hence, the subject of the invention is a method for forming a semiconducting portion by epitaxial growth on a strained germination portion, comprising the steps of:

i) providing a stack, formed of a germination layer covering a sacrificial layer disposed on a support layer, said germination layer exhibiting a non-zero initial value of tensile strain;

ii) structuring the germination layer in such a way as to form a structured part and a peripheral part, the structured part comprising a central portion linked to the peripheral part by at least two lateral portions opposite one another in relation to the central portion, the lateral portions exhibiting a greater average width than an average width of the central portion;

iii) producing a cavity under the structured part while rendering free a surface of the support layer situated facing the structured part, the central portion, termed the strained germination portion, then being strained under tension to a final value greater than the initial value;

iv) forming the semiconducting portion by epitaxial growth on the strained germination portion;

in which, during step iii), the structured part is furthermore placed in contact with said free surface in such a way as to bind the structured part of said free surface.

Some preferred but nonlimiting aspects of this method of production are the following:

During step ii), the germination portion can be strained so that, during step iv), the semiconducting portion is epitaxied in a substantially relaxed manner.

During step ii), the central portion can be linked to the peripheral part by at least two lateral portions opposite one another in relation to the central portion, so that, during step iii), the central portion is strained by the lateral portions.

The method can furthermore comprise the following steps of:

prior to step i) of providing the stack, estimating a final value of tensile strain for which the germination layer exhibits a lattice constant substantially equal to the so-called natural lattice constant of the semiconducting portion;

determinating the structuring so that, after step iii) of producing the cavity, the strained germination portion exhibits said final value of tensile strain, and therefore a lattice constant substantially equal to the natural lattice constant of the semiconducting portion, so that, during step iv), the semiconducting portion is epitaxied in a substantially relaxed manner.

During the determination step, the average width of the lateral portions and the average width of the central portion can be chosen so that the central portion exhibits, during the step of producing the cavity, said final value of tensile strain.

The semiconducting portion can exhibit a natural lattice constant greater than the natural lattice constant of the germination layer. The lattice constant of the layers and portions is measured in a plane of the layer or of the portion considered parallel to the plane of the support layer.

Step iv) can comprise a prior sub-step in which a growth mask is deposited on the structured part so as to cover the lateral portions and to render free a surface of the central germination portion, termed the germination surface, the semiconducting portion being formed on the basis of the germination surface.

Subsequent to step iii), the structured part can be tied to the free surface of the support layer by molecular bonding, and it is possible to perform the following sub-steps of:
a) determining a minimum value of molecular bonding energy of the structured part on the support layer, together with a minimum value of bonded area of the lateral portions on the support layer, these minimum values being such that said molecular bonding energy is greater than an elastic energy of the structured part;
b) after step iii) or iv), performing a consolidation annealing at an annealing temperature such that the molecular bonding energy exhibits a value greater than or equal to said previously determined minimum value; and then
c) etching a distal part of the lateral portions in relation to the strained germination portion, so that the bonded area of the lateral portions exhibits a value greater than or equal to said previously determined minimum value.

It is possible to carry out step c) of etching after step iv) of epitaxial growth in the course of which the consolidation annealing step b) is performed.

During step c), it is possible to etch a distal part of the lateral portions joining with the peripheral part of the germination layer.

Subsequent to step c), the structured part can exhibit a substantially plane upper face opposite to the support layer.

During step iii), it is possible to produce the cavity and to carry out the contacting by HF vapor-phase etching optionally followed by the deposition and then the evaporation of a liquid at the level of the cavity, and during step b) the annealing temperature can be substantially greater than or equal to 200° C.

During step iii), it is possible to carry out an oxidation or a nitriding of said free surface and of a surface of the structured part oriented toward the free surface, and during step b) the annealing temperature can be substantially greater than or equal to 100° C.

Subsequent to step iii), a dielectric layer, arising from said oxidation or nitriding carried out, can be formed at the interface between the structured part and the support layer, which exhibits a thickness of preferably greater than or equal to 10 nm.

During step ii), the structuring of the lateral portions can be carried out so that, during step iii), the strained germination portion exhibits a uniaxial or biaxial deformation.

The epitaxied semiconducting portion can comprise at least one doped part with a doping level of greater than or equal to $2.10^{18}$ cm$^{-3}$.

The invention also pertains to a method for producing an optoelectronic device comprising a semiconducting portion obtained by the method according to any one of the previous characteristics, in which a PN or PIN junction is produced in the semiconducting portion, the junction extending in a manner substantially orthogonal or parallel to the plane of the support layer.

It is possible to produce an optical cavity in which is situated the semiconducting portion whose material is suitable for forming a gain medium, the device obtained being suitable for emitting a coherent light beam.

The invention also pertains to a semiconducting structure comprising a semiconducting portion epitaxied on a strained portion of germination tied by molecular adhesion to a support layer.

BRIEF DESCRIPTION OF THE DRAWINGS

Other aspects, aims, advantages and characteristics of the invention will be better apparent on reading the following detailed description of preferred embodiments of the latter, given by way of nonlimiting example and with reference to the appended drawings in which.

DETAILED DESCRIPTION OF PARTICULAR EMBODIMENTS

In the figures and in the rest of the description, references that are the same represent identical or similar elements. Moreover, the various elements are not represented to scale so as to enhance the clarity of the figures. Moreover, the various embodiments and variants are not mutually exclusive and can be combined with one another. Unless indicated otherwise, the terms "substantially", "about", "of the order of" signify to within 10%.

The invention relates in a general manner to a method for forming a semiconducting portion by epitaxial growth on a strained germination portion, the latter resting on a support layer.

Portion is understood to mean a structure whose dimensions in a plane orthogonal to its thickness direction are smaller than those of the support layer on which it rests. A strained portion is a portion whose crystallographic structure is strained, here under tension or under compression, deforming the crystal cell in a plane parallel to the interface between the portions. The layer is strained in tension when it undergoes a mechanical strain which tends to stretch the cells of the crystal lattice in the plane of the layer. This is manifested by the presence of a compressive strain of the cells of the crystal lattice which is oriented along an axis substantially orthogonal to the plane of stretch, that is to say to the plane of the layer. The portion is on the contrary termed relaxed when its crystallographic structure is unstrained, that is to say when its lattice constant is identical to the natural lattice constant of the material. The lattice constant considered here is that oriented in a plane parallel to the interface between the epitaxied semiconducting portion and the strained germination portion. Germination portion is understood to mean a portion made of a material that enhances the growth of the semiconducting portion.

A preferred embodiment of a method for producing a semiconducting structure, comprising a portion of strained monocrystalline germanium, bonded by molecular adhesion to a silicon support layer, on which is epitaxied with cell matching a semiconducting portion of monocrystalline $Ge_{1-x}Sn_x$, is described subsequently. The semiconducting portion is epitaxied so that its crystallographic structure is substantially relaxed, its lattice constant then being substantially identical to its natural lattice constant. Alternatively, a deformation of the epitaxied portion can be generated, the thickness of the epitaxied portion then being less than the critical thickness whose value depends in particular on the atomic proportion of the elements in the GeSn compound. The deformation can be measured directly by X-ray diffraction or TEM, or indirectly by Raman spectroscopy.

In a general manner, the material of the epitaxied semiconducting portion is crystalline, preferably monocrystalline, and can be chosen in particular from among the elements of column IV of the periodic table, such as silicon, germanium, tin in its semiconducting phase, and the alloys formed of these elements, for example SiGe, GeSn, SiGeSn. It can also be chosen from among the alloys comprising elements of columns III and V of the periodic table, for example GaInAs and InP, or indeed comprising elements of columns II and VI, for example CdHgTe. Moreover, the material of the germination layer is suitable for enhancing the growth of the semiconducting portion to be epitaxied, and can comprise elements of column IV of the periodic table, or indeed of columns III and V. The material of the support layer can be chosen from among silicon, sapphire, borosilicate, silica, glass, quartz or any other material suitable for being bonded by molecular adhesion to the material of the germination layer. Finally, the material of the sacrificial layer can be chosen from among silicon, an oxide or a nitride, for example of silicon.

FIGS. 1a to 1e illustrate steps of a method for forming a semiconducting portion epitaxied on a strained germination portion, the latter resting on a support layer, according to a first embodiment. In this example, the epitaxied portion is produced from germanium-tin, the germination portion is made of tensile-strained germanium and the support layer is made of silicon.

An orthonormal frame (X, Y, Z) is defined here, where X and Y are the horizontal axes defining a plane parallel to the planes along which the various layers and portions extend, and where Z is the vertical axis along which the thickness of the layers and portions is defined. The terms "up/down", "lower/upper" are defined along the vertical axis Z.

Figure 1A:
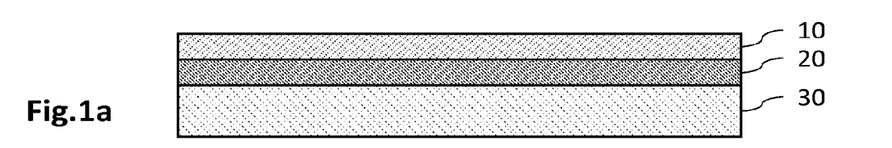
FIGS. 1a to 1e illustrate, in a schematic manner and in sectional view, various steps of a method for forming a semiconducting portion by epitaxial growth on a strained germination portion, tied to a support layer by hydrophobic molecular bonding.

According to a first step illustrated in FIG. 1a, a stack formed of a germination layer 10 tied to a support layer 30 by way of a sacrificial layer 20 is produced.

The stack is produced here in the form of a GOI (for Germanium On Insulator) substrate, that is to say of a germination layer 10 of germanium covering a sacrificial layer 20 of silicon oxide resting here on a silicon support layer 30. This stack is preferably produced by means of the method described in the publication by Reboud et al. entitled *Structural and optical properties of* 200 *mm germanium-on-insulator* (*GeOI*) *substrates for silicon photonics applications*, Proc. SPIE 9367, Silicon Photonics X, 936714 (Feb. 27, 2015) which implements in particular the Smart Cut™ technology.

More precisely, the epitaxial growth of a germanium semiconducting layer on a thick silicon layer is performed firstly. The germanium layer then exhibits, at ambient temperature, a tensile residual deformation of the order of 0.2%. A dielectric layer, for example a silicon oxide, is thereafter deposited on the free surface of the germanium layer, and then an implantation of $H^+$ ions is performed in the germanium layer. Thereafter, the dielectric layer covering the germanium layer is tied to a handle substrate formed of a dielectric layer covering a silicon layer. The germanium layer is separated into two parts at the level of a zone which is embrittled by the ion implantation. A monocrystalline germanium layer 10 covering a sacrificial layer 20, made here of silicon oxide, which rests on a support layer 30, made here of silicon, is thus obtained. The silicon support layer 30 can be a layer of a substrate of SOI (for Silicon On Insulator) type. The layer 10 is termed a germination layer insofar as its material is suitable for the subsequent epitaxial growth of a semiconducting portion. The free, that is to say exposed, surface of the germanium layer can thereafter be cleaned by reactive ion etching (RIE) optionally followed by a chemical mechanical polishing (CMP).

Alternatively, it is possible to produce the stack by epitaxial growth of a germanium layer on a substrate, the germanium layer thereafter being covered with a silicon oxide layer. This stack is tied by molecular bonding to a second stack formed of a silicon layer covered with a silicon oxide layer, the bonding being carried out by placing the silicon oxide layers in mutual contact. The substrate is thereafter totally eliminated, for example by grinding, so as to thus obtain the germanium germination layer bound to a silicon support layer by a sacrificial silicon oxide layer. This approach is in particular described in the publication by Jan et al. entitled *Tensile-strained germanium-on-insulator substrate for silicon-compatible optoelectronics*, Opt. Express 1, 1121-1126 (2011).

The germination layer can exhibit, according to the electronic or optoelectronic applications envisaged, a thickness of the order of a few tens of nanometers to a few microns. The sacrificial layer can exhibit a thickness of the order of a few tens of nanometers to a few microns. The support layer can exhibit a thickness of a few tens of nanometers to a few hundred microns.

The production of the germination layer 10 of desired thickness by means of the method described in the publication by Reboud et al. 2015 is particularly advantageous insofar as the crystalline quality of the germination layer 10 is particularly high and substantially homogeneous along the thickness of the layer. By way of example, the density of dislocations can be less than $10^7$ cm$^{-2}$ over the entire thickness of the layer, in particular at the level of the interface with the sacrificial layer 20.

The germination layer 10 here exhibits a smaller natural lattice constant than that of the semiconducting portion to be epitaxied. Moreover, it exhibits a non-zero tensile strain, that is to say that the strain of the semiconducting layer, in the plane XY of the layer, exhibits a non-zero and positive initial value $\sigma_{pc}^i$. Here, the initial value $\sigma_{pc}^i$ of strain of the germination layer 10 is not sufficient for its lattice constant to be substantially equal to the natural lattice constant of the semiconducting portion to be epitaxied.

Figure 2A:
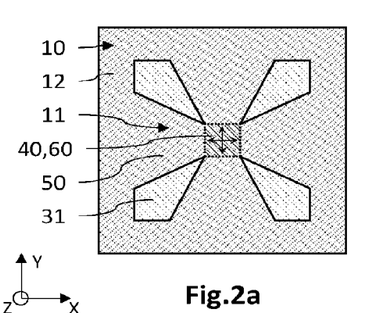
FIG. 2a illustrates in a schematic manner and viewed from above a semiconducting portion epitaxied on a strained germination portion undergoing a biaxial deformation.
Figure 3A:
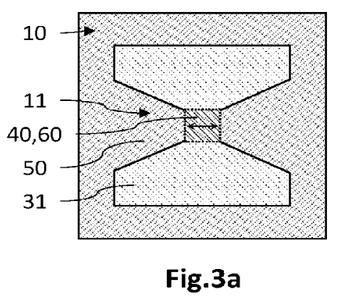
FIG. 3a illustrates in a schematic manner and viewed from above a semiconducting portion epitaxied on a strained germination portion undergoing a uniaxial deformation.

According to a second step (not represented in FIG. 1a), the germination layer 10 is structured in such a way that it exhibits a structured part 11 and a peripheral part 12, the structured part 11 comprising a central portion 40 linked to the peripheral part 12 which here surrounds the structured part 11. In this example, lateral portions 50 link the portion 40 of the peripheral part 12 (cf. for example FIG. 1b, 2a or 3a). The structured part 11 is produced by conventional steps of lithography and then of etching of the germination layer 10, which are therefore not detailed here. As shown by FIG. 2a or 3a, the central portion 40 can exhibit a substantially square or rectangular shape, in the plane (X, Y), of a few hundreds of nanometers to a few microns along a side. Other shapes are possible, such as elongate or indeed polygonal shapes.

Here at least two lateral portions 50 are produced which each link a boundary of the central portion 40 to the peripheral part 12. They are arranged pairwise in relation to the central portion 40 in such a way as to define at least one substantially rectilinear deformation axis. In the example of FIG. 2a, two pairs of lateral portions 50 are represented where the latter each extend to part of a boundary of the central portion 40 of substantially square shape as far as the peripheral part 12. The lateral portions 50 are arranged pairwise in such a way as here to define two mutually secant deformation axes at the level of the central portion 40. Thus, a biaxial deformation of the central portion 40, oriented along the two deformation axes, will be able to be generated when the structured part 11 is suspended during a subsequent step. In the example of FIG. 3a, a single pair of lateral portions 50 is represented where the latter are arranged in such a way as to define a single deformation axis of the central portion 40. Thus, a uniaxial deformation will be able to be generated in the central portion 40 during a subsequent step.

The central portion 40 is intended to become a strained portion, here under tension, therefore exhibiting a deformation of its crystallographic structure through an increase in its lattice constant. The lateral portions 50 are thus intended to place the central portion 40 under tension, preferably without however themselves undergoing an appreciable mechanical strain. Hence, the lateral portions 50, or tensioner arms, and the central portion 40 are formed so that the average width "b" of the tensioner arms 50 is greater than the average width "a" of the central portion 40, preferably ten times greater than the latter. Width is understood to mean the transverse, to its longitudinal axis, dimension of a portion or of an arm, in the plane (X, Y). The central portion 40 here exhibits an average width "a" oriented along the axis Y and substantially constant along the longitudinal axis X. The tensioner arms 50 exhibit an average width "b" oriented here along the axis Y. Furthermore, the surface areal dimension in the plane (X, Y), and in particular the width of each lateral portion 50, that is to say the transverse dimension substantially orthogonal to the deformation axis, is chosen so that the lateral portion 50 exhibits substantially no or little deformation. More precisely, the average deformation, in the thickness of the lateral portion 50, decreases as one moves away from the strained portion 40 and becomes negligible at a distance of greater than or equal to one or two times the dimension of the strained portion 40. The average width of each lateral portion is greater than the average width of the central portion, preferably ten times greater than the latter. The average deformation of the lateral portion 50, that is to say the deformation field integrated in the volume of the lateral portion exhibits a lower value than that of the strained portion, or indeed is negligible in relation to the average deformation in the strained portion. In the examples of FIGS. 2a and 3a, the lateral portions 50 exhibit a trapezium shape so that the width increases as one moves away from the central portion 40. Other shapes are possible, for example a shape where the lateral portions exhibit an abrupt increase in width in relation to the central portion and then a main zone with constant width.

The structuring can be carried out so as to control the value of the amplification of the tensile strain of the central portion 40 of the germination layer 10, obtained subsequently during production of the cavity. Hence, one predetermines the dimensional parameters of the structured part 11, for example the widths and lengths of the central portion 40 and of the tensioner arms 50. By way of example, in the case of a rectangular central portion 40, of length A and of constant width a, and rectangular tensioner arms 50 of length B/2−A/2 and of constant width b, an amplification factor f linking the final tensile strain $\sigma_{pc}^f$ to the initial tensile strain $\sigma_{pc}^i$ can be expressed through the following relation formulated in the article by Süess et al entitled *Analysis of enhanced light emission from highly strained germanium microbridges*, Nature Photon. 7, 466-472 (2013):

$$f = \frac{2L+B}{B}\left(1 + \frac{A}{B-A}\right) \bigg/ \left(\frac{a}{b} + \frac{A}{B-A}\right)$$

where L is the length of the sacrificial layer 20 eliminated under the structured part 11 during the subsequent step of producing the cavity. Thus, as a function of the dimensional parameters of the structured part 11 of the germination layer 10, it is possible to control the value of the amplification of the tensile strain applied to the central portion 40 during the production of the cavity. The amplification factor can also be estimated by means of numerical simulation software such as COMSOL Multiphysics.

Thus, a locally structured germination layer 10 covering the sacrificial layer 20 is obtained. The germination layer 10 exhibits a structured part 11 comprising a central portion 40, here linked by lateral portions 50 to a peripheral part 12 of the layer 10. The central portion 40 is intended to undergo a tensile strain arising from a deformation generated by the lateral portions 50.

Figure 1B:
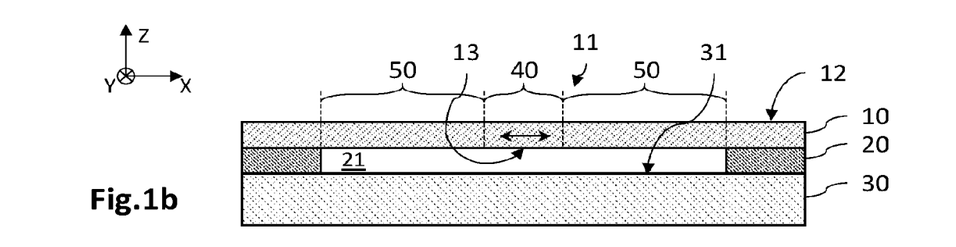
Figure 1C:
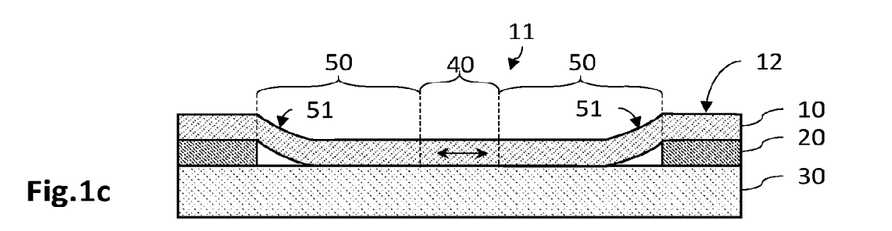

According to a third step illustrated in FIGS. 1b and 1c, a cavity is produced under the structured part of the germination layer while rendering free a surface of the support layer situated facing the structured part, so as to suspend it above this free surface. The central portion is then placed under strain, here under tension by the lateral portions. Next, according to the invention, the suspended structured part is placed in contact with the free surface of the support layer. A surface termed free or rendered free is an exposed surface on which a material can be deposited.

Initially, as illustrated in FIG. 1b, the cavity 21 is produced by wet etching of the sacrificial layer 20 rendered accessible by openings obtained during the structuring of the germination layer 10. Here the wet etching uses hydrofluoric acid (also called HF, for Hydrogen Fluoride) in the vapor phase. The HF vapor flux can be low so as to etch the sacrificial layer at a moderate speed of the order of 10 nm per minute. More precisely, the vapor flux can, by way of example, comprise hydrofluoric acid at 15 torr of partial pressure, alcohol at 0.01 torr and nitrogen at 60 torr. Thus, the part of the sacrificial layer 20 situated under the structured part 11 of the germination layer 10 is etched over its entire thickness. The structured part 11 is then suspended above the rendered-free surface 31 of the support layer 30, thus forming a cavity 21. The cavity 21 is therefore situated between the structured part 11 and the free surface 31 of the support layer 30.

A suspended structured part 11 is thus obtained, which takes the form of a suspended membrane, whose lateral portions 50 now form tensioner arms which maintain the central portion 40 above the free surface 31 of the support layer 30 and generate in the central portion 40 a tensile mechanical strain oriented along the deformation axes. The lower surface 13 of the structured part 11 and the free surface 31 of the support layer 30 here exhibit a roughness of less than or equal to about 10 nm RMS, propitious to the molecular bonding performed during a subsequent step. The respective dimensions of the central portion 40 and of the lateral portions 50 are such that the tensioner arms generate a tensile strain in the strained portion substantially equal to a predetermined value of deformation. In the subsequent description, the central portion 40 is called strained germination portion and the lateral portions 50 are called tensioner arms.

Subsequently, and according to the invention, as illustrated in FIG. 1c, the suspended membrane 11, more precisely the strained portion 40 and at least one part of the tensioner arms 50 are placed in contact, in such a way as to bind the structured part 11 with the free surface 31 of the support layer.

Hence, the structured part 11 is immersed here in a liquid solution, for example of alcohol or of acidified deionized water (pH close to 2), and then the liquid is evaporated. During the evaporation phase, the suspended structured part 11 comes naturally into contact with the free surface 31 of the support layer. Thus, it rests on the support layer, so that the lower surface of at least one part of the tensioner arms 50 is in contact with the free surface 31. The lower surface of the strained portion 40 can be totally, partially, or not in contact with the free surface 31.

Placing these surfaces in contact ensures direct bonding, here of hydrophobic type, of the structured part 11 with the support layer 30. The direct bonding is here of hydrophobic type insofar as the surfaces are tied together by way of hydrogen bonds. At ambient temperature, as illustrated by FIG. 5 representing the evolution of the energy per unit area of hydrophobic bonding between the bonded surfaces, the hydrophobic bonding energy is here of the order of 5 mJ/m².

The structured part 11 is tied to the layer by direct bonding, also called molecular bonding or bonding by molecular adhesion, that is to say that the tying of surfaces is carried out without introducing any adhesive layer (of adhesive, glue, type etc) but by way of the attractive forces of atomic or molecular interaction between the surfaces, for example Van der Walls forces, hydrogen bonds, or indeed covalent bonds. As is detailed subsequently, the molecular bonding can be of hydrophilic or hydrophobic type. The bonding is of hydrophilic type when it relates to the adhesion of hydrophilic surfaces, that is to say of surfaces having the capacity to bind with water molecules through an adsorption mechanism. The bonding then involves hydrogen bond forces, the interaction intensity of which is particularly high. Hence, hydrophilic surfaces are terminated in hydroxyl groups (—OH). Alternatively, the bonding can be of hydrophobic type and then relate to surfaces which do not have the capacity to adsorb water. Hence, hydrophobic surfaces can be saturated with atoms such as hydrogen or fluorine.

Placing in contact is understood to mean the contacting of the lower surface 13 of the structured part with the surface rendered free 31 of the support layer. These surfaces can be formed of the component material mainly making up the layers or of an insert material different from this main material. The germination layer and the support layer can thus comprise a thin layer of an insert material obtained for example by deposition or by oxidation, preferably after formation of the cavity. In the method described here involving hydrophobic bonding, the germination layer and the support layer do not comprise any insert material.

A structured part 11 of the germination layer 10 is thus obtained, tied to the free surface 31 of the support layer 30, here by molecular bonding of hydrophobic type. The unbonded part of the tensioner arms 50 is situated in the so-called distal zone 51, where the arms join up with the peripheral part 12 of the germination layer 10, the latter resting on the unetched part of the sacrificial layer 20.

As a variant, the step of producing the cavity 21 and of placing the structured part 11 in contact with the free surface 31 of the support layer can be carried out at the same time. Hence, the cavity 21 is for example produced by wet etching with liquid HF or indeed with vapor HF at high pressure. In the case of HF vapor etching, the vapor flux can comprise hydrofluoric acid at 60 torr of partial pressure, alcohol at 0.1 torr and nitrogen at 75 torr. The gas flux then leads to a more significant etching speed than that mentioned previously, for example of the order of 100 nm/min, during a non-equilibrium etching reaction. Hence, drops of water and of hydrofluoric acid, products of the chemical reaction, form in the cavity and cause, by evaporating, the structured part to be placed in contact with the free surface of the support layer.

Figure 1D:
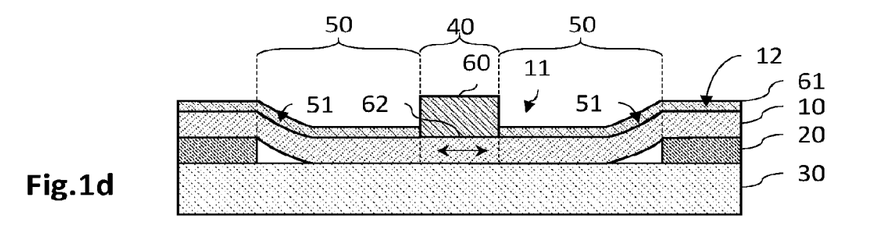

According to a fourth step illustrated in FIG. 1d, a semiconducting portion 60 is formed by epitaxial growth on the strained germination portion 40.

In the example represented, the semiconducting portion 60 is localized solely facing the strained germination portion 40. Hence, a growth mask 61 is deposited so as to cover the structured part 11 as well as the peripheral part 12, and then an opening is produced which renders free, that is to say exposed, an upper surface 62 of the strained germination portion, then termed the germination surface.

The semiconducting portion, made for example of germanium-tin $Ge_{1-x}Sn_x$, is thereafter formed by epitaxy on the germination surface of the strained portion. It can be formed by techniques of chemical vapor deposition (CVD), such as low-pressure chemical deposition (LPCVD, for Low Pressure Chemical Vapor Deposition), metal-organic chemical vapor deposition (MOCVD), plasma-enhanced chemical vapor deposition (PECVD), hydride vapor phase epitaxy (HVPE), or indeed also reactive cathodic sputtering. Techniques such as the molecular beam epitaxy (MBE) or liquid phase epitaxy (LPE) can also be used.

A semiconducting portion epitaxied on a strained germination portion is thus obtained, itself resting on a support layer. It is therefore tied to the support layer and is spaced apart therefrom essentially through the presence of the strained germination portion. The absence of any cavity between the germination portion and the support layer makes it easier to carry out conventional subsequent microelectronics operations, such as the deposition of thin layers, lithography, etching, or indeed the doping of layers. This therefore allows the subsequent production of microelectronic or optoelectronic devices comprising such an epitaxied semiconducting portion.

Moreover, the absence of any cavity ensures better mastery of the epitaxy of the semiconducting portion, dispensing with the risks of undesired growth inside the cavity. Moreover, the epitaxy is better controlled insofar as the germination portion rests on the support layer, thereby ensuring direct thermal contact between these two elements and therefore better mastery of the epitaxy temperature at the level of the germination portion. Finally, the absence of any cavity increases the proximity between the epitaxied semiconducting portion and the support layer and enables possible optical coupling between the semiconducting portion forming for example the gain medium of a coherence light source with a waveguide disposed at the level of the support layer, the latter then forming a layer of a silicon-based photonic platform.

Moreover, mastery of the deformation of the crystallographic structure of the strained germination portion by the tensioner arms makes it possible to obtain the absence or otherwise of strains in the semiconducting portion. It is advantageous that the semiconducting portion is epitaxied with cell matching, so that the crystallographic structure is not deformed during the epitaxial growth, the effective lattice constant of the strained germination portion then being substantially equal to the natural lattice constant of the epitaxied semiconducting portion. Thus, the absence of strains in the semiconducting portion makes it possible to limit the risks of plastic relaxation and therefore of formation of structural defects of cell mismatch dislocation type. Thus, the semiconducting portion exhibits optimal electronic and/or optical properties.

Figure 1E:
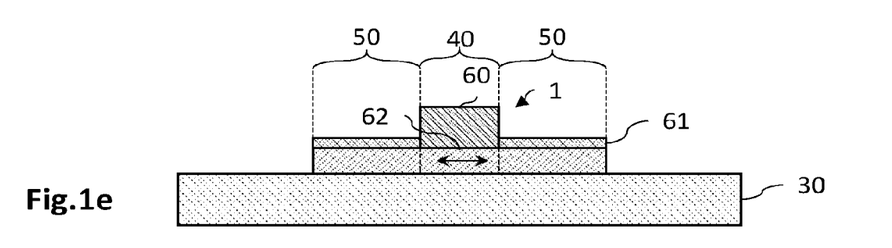

According to a fifth optional step, as illustrated by FIG. 1e, the structure formed of the epitaxied semiconducting portion 60 covering the strained germination portion 40 and of at least one part of the tensioner arms 50 is individualized, that is to say it is separated from the peripheral part 12 of the germination layer 10. To separate, render distinct or individualize, is understood to mean here that the structured part 11 is no longer linked to the peripheral part 12 by the tensioner arms 50, by etching of a distal part 51 of the tensioner arms 50. The distal portion 51 of the tensioner arms corresponds to the zone of the tensioner arms 50 that is remote from the strained portion 40 and forms the join with the peripheral part 12.

Figure 4:
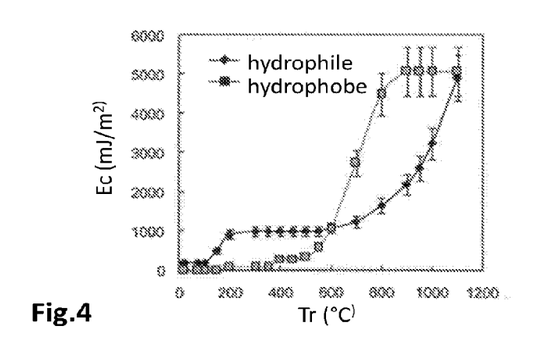
FIG. 4 illustrates an exemplary relation between the energy per unit area of hydrophilic and hydrophobic bonding between the structured part and the support layer as a function of a consolidation annealing temperature of the molecular bonding.

On completion of the epitaxial growth step, the stack formed of the bonded structured part 11, comprising the strained portion 40 and the tensioner arms 50 resting on the support layer 30, on which the epitaxied portion 60 is situated, exhibits:

a bonding energy Ec, arising from the hydrophobic molecular bonding on the support layer. It can be estimated, to first order, through the relation:

$$E_c \approx E_s(S_{bt} + S_{pc}) \tag{1}$$

where Es is the surface energy evaluated on the basis of the relation illustrated in FIG. 4, and $S_{bt}$ et $S_{pc}$ are the respective surface areas of the tensioner arms and of the strained portion. The bonding energy tends to stabilize the bonded structured part and to avoid any relaxation of the strains liable to modify its mechanical resilience;

an elastic energy Ee, arising from the mechanical tensile strain related to the deformation of the portion strained by the tensioner arms. It can be estimated through the relation:

$$E_e \approx \tfrac{1}{2} \iiint_{x,y,z} E \cdot \in^2 dxdydz \tag{2}$$

where E is the local Young's modulus and $\in$ the local deformation undergone by the semiconducting structure (formed of the strained portion 40, of the epitaxied portion 60, and of the lateral portions 50). The elastic energy tends to destabilize the bonded semiconducting structure so as to relax the strains naturally.

It may be noted that, to first order, the bonding energy comprises a predominant term related to the bonded area of the tensioner arms, this generally being greater than the bonded area of the strained portion. Moreover, the elastic energy comprises a predominant term related to the deformation of the strained portion, insofar as the tensioner arms exhibit an average deformation value close to the residual deformation value, the latter being less than the value of the deformation undergone by the strained portion.

With the aim of producing a structured part 11 whose mechanical resilience is safeguarded, and which can be separated from the peripheral part 12, the bonding energy must be greater than the elastic energy, this being manifested to first order through the following inequality:

$$E_c(E_s^{min}; S_{bt}^{min}) > E_e(S_{bt}^{min}) \tag{3}$$

Hence, firstly we determine both the minimum value of bonding energy per unit area $E_s^{min}$ and the minimum value of bonded area $S_{bt}^{min}$ of the tensioner arms, that are necessary in order to satisfy this inequality. Of course, this inequality can be specified by using more detailed expressions for the bonding energy and for the elastic energy, for example by integrating the strain field throughout the volume of the bonded structured part, while taking account of the presence of the epitaxied semiconducting portion, for example by means of, for example, finite element-based software for calculating strains such as COMSOL Multiphysics®.

Thus, by way of illustration, for a semiconducting portion of GeSn epitaxied with cell matching on a strained germination portion 40 made of germanium with a surface area $S_{pc}$ of 5 μm² exhibiting a uniaxial average deformation of 5.7%, with a thickness e of 300 nm, the Young's modulus being equal to about 100 GPa, and the tensioner arms 50 exhibiting an average deformation close to the residual value of 0.2%, and finally for a bonding energy per unit area Es of 100 mJ/m², it emerges that the minimum bonded area $S_{bt}$ of the tensioner arms is equal to about 6550 μm². It is noted that by applying a thermal treatment at 600° C. for a few minutes to a few hours, the hydrophobic bonding energy per unit area $E_s$ goes to 1 J/m², thereby making it possible to obtain a minimum bonded area $S_{bt}^{min}$ of the tensioner arms of about 290 μm². Preferably, each of the two tensioner arms then exhibits a minimum bonded area $S_{bt}^{min}$ of 145 μm².

Thereafter, a strengthening of the molecular bonding of the structured part 11 tied to the free surface 31 of the support layer 30 may be necessary, so as to obtain a value Es of bonding energy per unit area greater than or equal to the minimum value $E_s^{min}$ determined previously. Hence, a thermal treatment is carried out, for example in the form of a consolidation annealing, in which the stack is subjected to an annealing temperature Tr for a few minutes to a few hours. By way of illustration, the annealing temperature can be 200° C. applied for 2 h, thereby increasing the hydrophobic bonding energy per unit area here from 5 mJ/m² to 100 mJ/m². The annealing temperature lies between a minimum value which depends in particular on the bonded minimum area $S_{bt}^{min}$ of tensioner arms that one wishes to preserve and a maximum value which depends in particular on the crystallographic quality to be safeguarded of the various materials of the stack. The maximum value of the annealing temperature may thus be less than the sublimation temperature of the various layers and portions present.

This thermal treatment can be a specific consolidation annealing sub-step carried out subsequent to the step of epitaxial growth of the semiconducting portion. As a variant, and in an advantageous manner, this thermal treatment is not a specific sub-step, but is carried out naturally during the epitaxial growth step. Indeed, the epitaxy temperature attains a value greater than or equal to the annealing temperature Tr mentioned previously. By way of example, the epitaxy temperature can be 600° C. whilst the minimum value of annealing temperature is 200° C. Thus, subsequent to the step of epitaxy of the semiconducting portion 60, the structured part 11 on which the epitaxied portion 60 rests exhibits a value Es of bonding energy per unit area greater than or equal to the predetermined minimum value $E_s^{min}$. A specific consolidation annealing sub-step is then not necessary.

Thus, a semiconducting structure is obtained, bonded to the support layer 30 with a bonding energy Ec whose value is greater than or equal to the predetermined minimum value. It is then possible to eliminate a part of the tensioner arms 50 so as to separate the structured part 11 from the peripheral part 12.

Finally, a distal portion 51 of the tensioner arms 50 is removed, by etching, so as to separate, or individualize, the structured part 11 in relation to the peripheral part 12. The distal portion 51 of the tensioner arms is eliminated, by conventional operations of optical and/or electron lithography and of etching, in such a way that the bonded structured part 11 comprises a value of bonded area $S_{bt}$ of the tensioner arms that is greater than or equal to the minimum value $S_{bt}^{min}$ determined previously. Distal portion 51 of the tensioner arms is understood to mean the zone of the tensioner arms 50 remote from the strained portion 40 and forming the join with the peripheral part 12. Thus, the bonded area of the tensioner arms 50 is sufficient for the bonded structured part 11 to exhibit a greater bonding energy than its elastic energy.

Thus, a semiconducting structure 1 with epitaxied portion 60 is obtained on a strained germination portion 40 bonded on the support layer 30 whose mechanical resilience is ensured. The semiconducting structure 1 exhibits a high crystalline quality, and the epitaxied portion 60 may or may not exhibit a deformation of its crystallographic structure. The strained germination portion 40 is tied to the support layer 30 by molecular bonding, for which the bonding energy and bonded area of the tensioner arms 50 make it possible to freeze the strain field.

Figure 8:
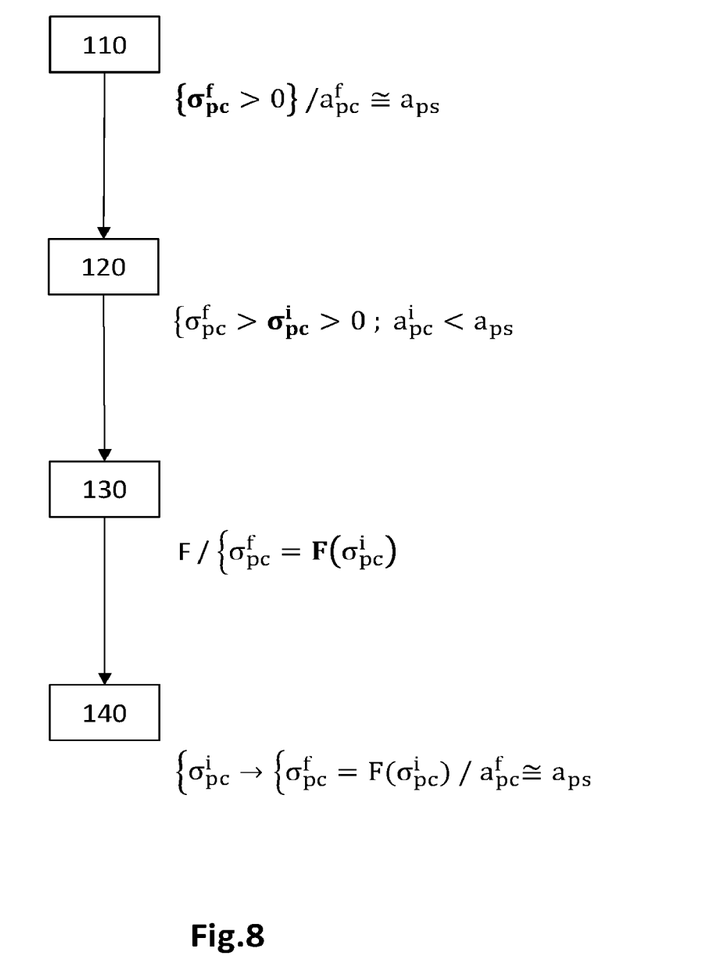
FIG. 8 is a flowchart of a method according to an embodiment making it possible to obtain a central portion of a germination layer whose lattice constant is substantially at the natural lattice constant of the semiconducting portion to be epitaxied.

FIG. 8 illustrates a flowchart of a method according to an embodiment, making it possible to obtain a central portion 40 of the germination layer 10 whose lattice constant is substantially equal to the natural lattice constant of the semiconducting portion 60.

During a first step 110, for the germination layer 10, a final value $\sigma_{pc}^f$ of tensile strain for which the lattice constant of the germination layer 10 exhibits a final value $\alpha_{pc}^f$ substantially equal to the natural lattice constant $a_{ps}$ of the semiconducting portion 60 is estimated.

During a second step 120, the stack is provided in which the germination layer 10 exhibits a tensile strain in the plane (X, Y) of non-zero and positive initial value $\sigma_{pc}^f$ but less than $\sigma_{pc}^f$. The semiconducting layer 10 then exhibits a lattice constant of an initial value $a_{pc}$, smaller than the value $a_{ps}$.

During a third step 130, a structuring of the germination layer 10 is determined and then carried out so as to form the structured part 11 described previously. The structuring is determined so that the formation of the subjacent cavity 21 of the structured part 11 causes an increase in the tensile strain of the central portion 40, which then goes from the initial value $\sigma_{pc}^i$ to the final value $\sigma_{pc}^f$. Hence, the transfer function making it possible to go from $\sigma_{pc}^i$ to $\sigma_{pc}^f$ is denoted F, stated otherwise: $\sigma_{pc}^f = F(\sigma_{pc}^i)$. The transfer function F is parametrized essentially by the dimensions of the structured part 11, and in particular by the average width of the tensioner arms 50 and that of the central portion 40. The transfer function can be identical or similar to the amplification factor f mentioned previously. The parameters of the transfer function F are therefore determined, for example by numerical simulation with the aid of the COMSOL Multiphysics software or by satisfying the relation mentioned previously.

During a fourth step 140, the cavity 21 is formed under the structured part 11 by partial etching of the sacrificial layer 20. Thus, the central portion 40 goes from the initial value $\sigma_{pc}^i$ to the final value $\sigma_{pc}^f = F(\sigma_{pc}^i)$ of tensile strain in the plane (X, Y). A central germination layer 40 which exhibits a value $\alpha_{pc}^f$ of the lattice constant substantially equal to the natural value $a_{ps}$ of the lattice constant of the semiconducting portion 60 is thus obtained. Hence, during the epitaxial growth step, the semiconducting portion 60 grows in a substantially relaxed manner.

Figure 2B:
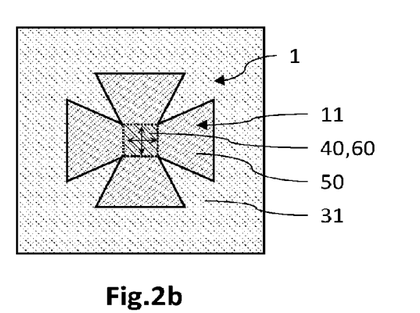
FIG. 2b illustrates the structured part separated from a peripheral part of the germination layer.

FIGS. 2a and 2b illustrate two steps of the previously described method corresponding respectively to FIGS. 1e and 1e. In FIG. 2a is illustrated the structured part 11 bonded by molecular adhesion to the surface rendered free 31 of the support layer 30. The strained germination portion 40 is linked to the peripheral part 12 of the germination layer 10 by way of the tensioner arms 50. Two pairs of tensioner arms 50 of identical dimensions are represented, thereby inducing a biaxial deformation of the strained portion 40, of substantially equal intensity along the two deformation axes here respectively parallel to the axes X and Y. As a variant, each pair of tensioner arms can exhibit different dimensions, so as to deform the strained portion 40 with a different intensity along each of the deformation axes. The semiconducting portion 60 is epitaxied from the germination surface of the strained portion 40. In FIG. 2b is illustrated the semiconducting structure 1 with epitaxied portion 60 on the strained germination portion 40, obtained by separating the structured part 11 from the peripheral part 12, by etching of the distal zone of the tensioner arms 50 joining with the peripheral part 12.

Figure 3B:
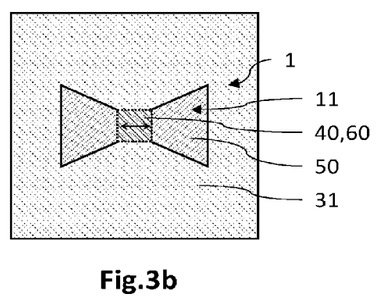
FIG. 3b illustrates the structured part separated from a peripheral part of the germination layer.

FIGS. 3a and 3b are similar to FIGS. 2a and 2b and are distinguished therefrom essentially in that the structured part 11 comprises a single pair of tensioner arms 50 ensuring the uniaxial tensioning of the strained portion 40. The latter then undergoes a uniaxial deformation along the deformation axis defined by the arrangement of the tensioner arms 50 in relation to the strained portion 40.

FIG. 3a illustrates the structured part 11 bonded by molecular adhesion to the surface rendered free 31 of the support layer 30, where the tensioner arms 50 link the strained portion 40 to the peripheral part 12. FIG. 3b illustrates the semiconducting structure 1 obtained on the basis of the bonded structured part 11 by etching the zone joining the tensioner arms 50 to the peripheral part (the latter also being eliminated).

FIG. 4 illustrates an exemplary relation between the bonding energy per unit area between a germanium surface and a silicon surface as a function of the annealing temperature, in the case of a bonding of hydrophilic type and of a bonding of hydrophobic type. Up to about 600° C., the bonding energy per unit area exhibits a lower value in the hydrophobic case than in the hydrophilic case. The trend reverses thereafter from about 600° C. onward. Moreover, in the hydrophilic case, the energy per unit area increases as soon as an annealing at about 100° C. is applied, and the energy goes from of the order of 100 mJ/m$^2$ at ambient temperature to 1 J/m$^2$ after an annealing at about 200° C. In the hydrophobic case, the energy goes from of the order of 5 mJ/m$^2$ at ambient temperature to 100 mJ/m$^2$ after an annealing at about 200° C.

FIGS. 5a to 5e illustrate a method for producing the semiconducting structure with strained portion according to a second embodiment. This method is distinguished from the first embodiment described with reference to FIGS. 1a to 1e essentially in that the molecular bonding is of hydrophilic type on the one hand, and in that the etching of the distal part 51 of the tensioner arms 50 is performed before epitaxy of the semiconducting portion 60 on the other hand.

The steps of providing a stack formed of a germination layer 10 tied to a support layer 30 by a sacrificial layer 20, and then the structuring of the germination layer 10 so as to form a structured part 11 and a peripheral part 12 are identical to those described previously, and are not detailed here further.

Figure 5A:
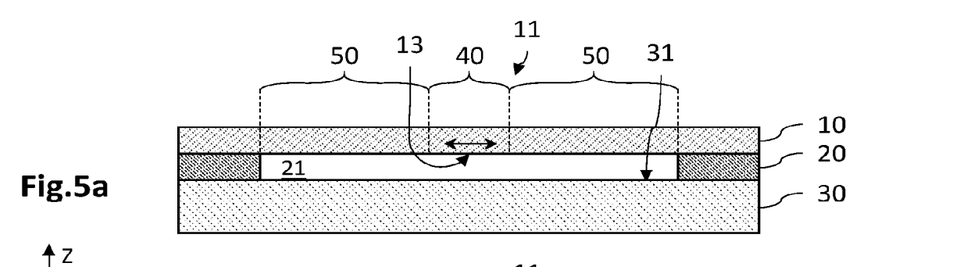
FIGS. 5a to 5e illustrate, in a schematic manner and in sectional view, various steps of a method for forming a semiconducting portion by epitaxial growth on a strained germination portion, tied to a support layer by hydrophilic molecular bonding.

FIG. 5a illustrates the production of a cavity 21 situated under the structured part 11, so as to suspend the structured part 11 above a surface rendered free 31 of the support layer 30. As mentioned previously, the cavity 21 can be produced by wet etching with a low vapor flux of hydrofluoric acid (HF) so as to etch the sacrificial layer at a moderate speed of the order of 10 nm per minute. More precisely, the vapor flux can, by way of example, comprise hydrofluoric acid at 15 torr of partial pressure, alcohol at 0.01 torr and nitrogen at 60 torr. Thus, the part of the sacrificial layer 20 situated under the structured part 11 is etched over its entire thickness. The structured part 11 is then suspended above the surface rendered free 31 of the support layer, thus forming a cavity 21.

Figure 5B:
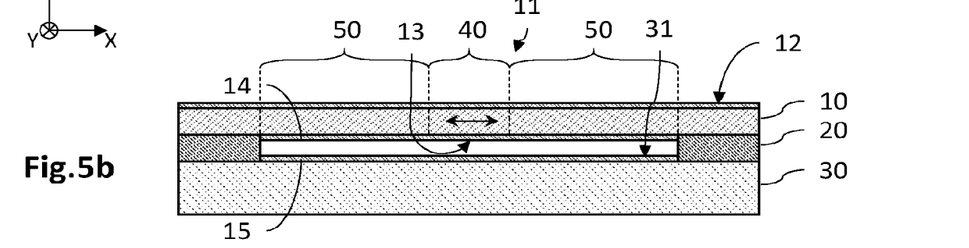

FIG. 5b illustrates a step of surface treatment of the structured part 11 and of the free surface 31 of the support layer, with the aim of subsequently ensuring the hydrophilic molecular bonding of these elements. During this step, the surface 13 of the structured part 11 facing the cavity 21 and the free surface 31 of the support layer are treated so that they are each formed of a thin layer 14, 15 of oxide or of nitride, of a thickness of a few nanometers to a few tens of nanometers.

According to a variant, the structured part 11 and the support layer 30 are covered, at the level of the cavity 21, with a thin oxide layer 14, 15 produced by oxidation. The thin oxide layers 14, 15 can be obtained by placing this zone of the stack in the open air for a sufficient duration, for example 1 h. They can also be obtained by an O$_3$ plasma oxidation technique, for example at ambient temperature, or indeed by an O$_2$ plasma oxidation technique, for example at a temperature of 250° C. Within the framework of the preferred example, the monocrystalline germanium structured part exhibits a lower surface 13 formed of a thin germanium oxide layer 14 with a thickness of the order of a few nanometers to a few tens of nanometers, and the free surface 31 of the silicon support layer is formed of a thin silicon oxide layer 15 with a thickness also of the order of a few nanometers to a few tens of nanometers.

According to another variant, the structured part 11 and the support layer 30 are covered, at the level of the cavity 21, with a thin oxide or nitride layer obtained by a thin film deposition technique. The layers are, for example, deposited by a technique of the ALD (for Atomic Layer Deposition) type, plasma assisted or not. The deposited material can be a silicon oxide or nitride, SiO$_2$ or Si$_3$N$_4$, or indeed be a hafnium oxide HfO$_2$, a titanium oxide TiO$_2$, or indeed an aluminum oxide Al$_2$O$_3$, or any other suitable material. Thus, within the framework of the preferred example, the structured part 11 made of monocrystalline germanium exhibits a lower surface 13 formed of a thin layer, for example, of silicon oxide with a thickness of the order of a few tens of nanometers, and the free surface 31 of the silicon support layer 30 is formed of a thin silicon oxide layer with a thickness also of the order of a few tens of nanometers.

A structured part 11 is thus obtained in the form of a suspended membrane which comprises a material arising from the oxidation or from the nitriding performed at the level of its lower and upper surfaces. The lower surface 13 of the structured part and the free surface 31 of the support layer here exhibit a roughness of less than or equal to about 10 nm RMS, propitious to the molecular bonding performed during a subsequent step.

As a variant, the surface 31 of the support layer 30 can be formed of an upper layer (not represented) made of a thermal oxide, that is to say obtained by thermal oxidation. The speed of HF wet etching of the sacrificial layer 20, when the latter is made of a deposited oxide, is greater than that of the upper layer of thermal oxide. Thus, during the step of producing the cavity 21, the sacrificial layer is eliminated at the level of the structured part 11 and the upper face 31 of the thermal oxide layer is then rendered free. It is thus possible to control the thickness of the oxide layer separating the semiconducting structure 1 in relation to the support layer 30. As a variant, the sacrificial layer can comprise a deposited oxide sub-layer, in contact with the germination layer 10, and a subjacent thermal oxide sub-layer, situated between the deposited oxide sub-layer and the silicon support layer 30, the sub-layers advantageously being separated by a thin etching barrier layer.

Figure 5C:
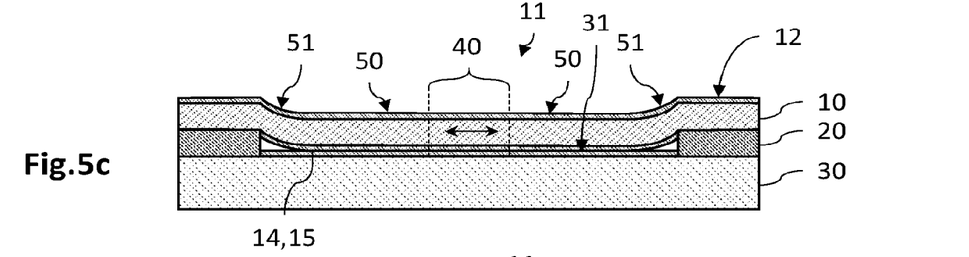

FIG. 5c illustrates the step of placing the structured part 11 in contact with the free surface 31 of the support layer. Hence, the suspended structured part 11 is immersed in a liquid solution, for example of alcohol or of acidified deionized water (pH close to 2), and then the liquid is evaporated. Preferably, the structured part 11 is immersed in a liquid solution of nitrogen (for example at a temperature of about 70K) or of helium (for example at a temperature of about 4K), and then the liquid is evaporated. During the immersion or evaporation phase, the suspended membrane 11 comes naturally into contact with the free surface 31 of the support layer. The use of helium or of nitrogen (or of any other appropriate liquid), therefore associated with a decrease in the temperature prior to placing the structured part 11 in contact on the support layer 30, makes it possible to generate a more significant tensioning of the structured part 11. Thus, the structured part 11 rests on the support layer 30, so that the lower surface of at least one part of the tensioner arms 50 is in contact with the free surface 31 of the support layer. The lower surface of the strained portion 40 can be in contact totally, partially, or indeed not be in contact with the free surface 31.

Placing these surfaces in contact ensures direct bonding of hydrophilic type of the structured semiconductor part on the support layer. At ambient temperature, as illustrated by FIG. 4, the hydrophilic bonding energy is here of the order of 100 mJ/m².

Here, placing in contact corresponds to contacting the lower surface 13 of the structured part with the free surface 31 of the support layer, these surfaces being formed of the thin layer 14, 15 obtained by oxidation or by deposition. Thus, a layer 14, 15 of an insert material is present between the component material mainly making up the structured part 11 and the component material mainly making up the support layer 30. This so-called insert layer 14, 15 exhibits a thickness of the order of a few tens of nanometers to one or more hundred nanometers. It is advantageously dielectric and can thus ensure the electrical insulation of the strained portion in relation to the support layer.

A step of determining the minimum value of bonding energy per unit area $E_s^{min}$, here hydrophilic, and the minimum value of bonded area $S_{bt}^{min}$ of the tensioner arms, necessary so that the hydrophilic bonding energy of the structured part is greater than the elastic energy of this same structured part, is performed.

Thus, by way of illustration, for a strained germanium portion with area $S_{pc}$ of 5 μm² exhibiting a uniaxial average deformation of 5.7%, with thickness e of 300 nm, the Young's modulus being equal to about 100 GPa, and the tensioner arms exhibiting an average deformation close to the residual value of 0.2%, and finally for a hydrophilic bonding energy per unit area $E_s$ of 1 J/m², the minimum bonded area $S_{bt}^{min}$ of the tensioner arms is about 290 μm².

A step of strengthening the molecular bonding of the structured part 11 tied to the free surface 31 of the support layer is performed thereafter, so as to obtain a value Es of hydrophilic bonding energy per unit area that is greater than or equal to the minimum value $E_s^{min}$ determined previously. Hence, a thermal treatment is carried out, in the form of a specific consolidation annealing sub-step, in which the stack is subjected to an annealing temperature Tr for a few minutes to a few hours. By way of illustration, the annealing temperature can be 200° C. applied for 2 h, thereby increasing the hydrophilic bonding energy per unit area here from 100 mJ/m² to 1 J/m².

Figure 5D:
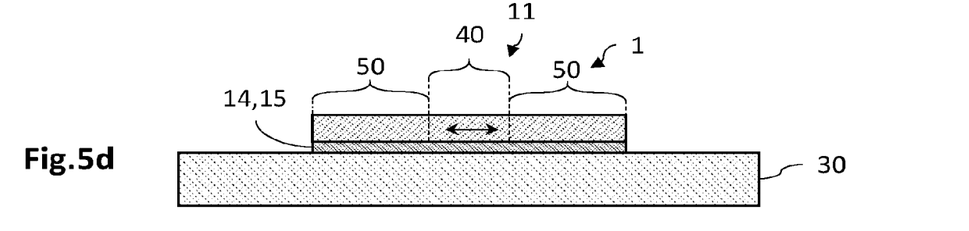

With reference to FIG. 5d, a distal portion 51 of the tensioner arms 50 is removed, by etching, so as to individualize the structured part 11 in relation to the peripheral part 12 of the germination layer 10. This step is similar to the step described previously with reference to FIG. 1e and is not detailed further here. Thus, a structured part 11 with strained germination portion 40 is obtained, bonded by hydrophilic molecular adhesion on the support layer 30, whose mechanical resilience is ensured. The method according to the second embodiment is therefore distinguished from the first embodiment in particular by the hydrophilic bonding, whose intensity is greater than that of the hydrophobic bonding up to annealing temperatures of the order of 500° C. to 600° C., and by the presence of a layer 14, 15 of an insert oxide or nitride at the interface between the structured part 11 and the support layer 30, whose dielectric property ensures electrical insulation between these elements. This insert material, in addition to a function of electrical insulation, can also ensure a function of evacuation of the heat possibly produced at the level of the strained portion, in the case where the latter forms an emissive layer of a luminous source.

Figure 5E:
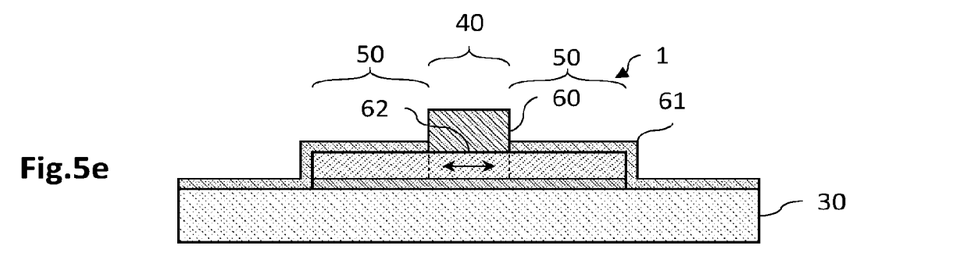

With reference to FIG. 5e, a semiconducting portion 60 is formed by epitaxial growth on the strained germination portion 40. Hence, a growth mask 61 is deposited firstly on the structured part 11 so that a germination surface 62 of the strained germination portion 40 is exposed. The epitaxy is performed thereafter so that the semiconducting portion 60 grows from the germination surface 62. This step is similar to that described previously with reference to FIG. 1e and is not detailed further.

A semiconducting structure 1 comprising an epitaxied portion 60 on a strained germination portion 40 of a structured part 11 bonded by hydrophilic molecular adhesion to the support layer 30 is thus obtained. The presence of the dielectric insert material 14, 15 at the interface between the epitaxied portion and the support layer makes it possible in particular to ensure electrical insulation of the epitaxied portion.

Various optoelectronic devices are now described comprising a semiconductor portion, epitaxied on the strained germination portion, obtained by the previously described method according to the invention. By way of illustration, the optoelectronic devices described subsequently comprise a semiconducting portion made of monocrystalline germanium-tin, epitaxied in a relaxed manner on a strained germination portion of monocrystalline germanium bonded on a silicon support layer. Of course, the materials mentioned here are mentioned purely by way of illustration and other suitable materials can be used.

Figure 6A:
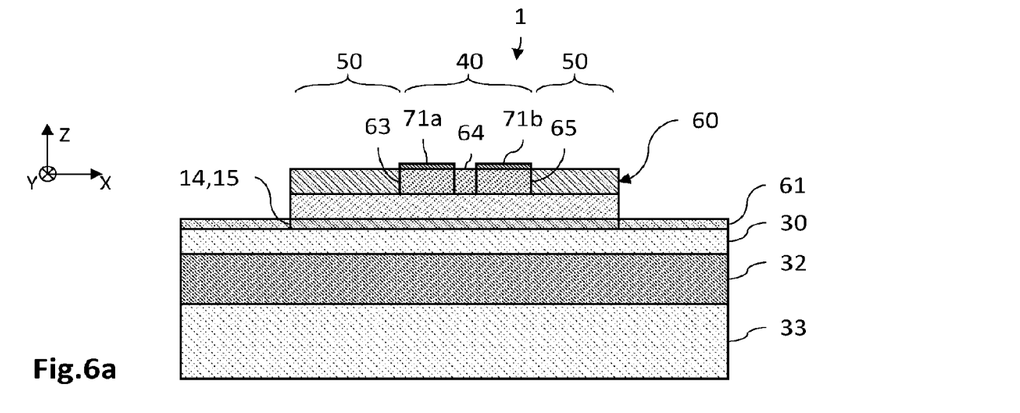
FIGS. 6a and 6b illustrate in a schematic manner and in sectional view two examples of optoelectronic device comprising a semiconducting portion epitaxied on a strained germination portion, the optoelectronic device here being a light-emitting diode comprising a PIN junction oriented in a vertical (FIG. 6a) or horizontal (FIG. 6b) manner.
Figure 6B:
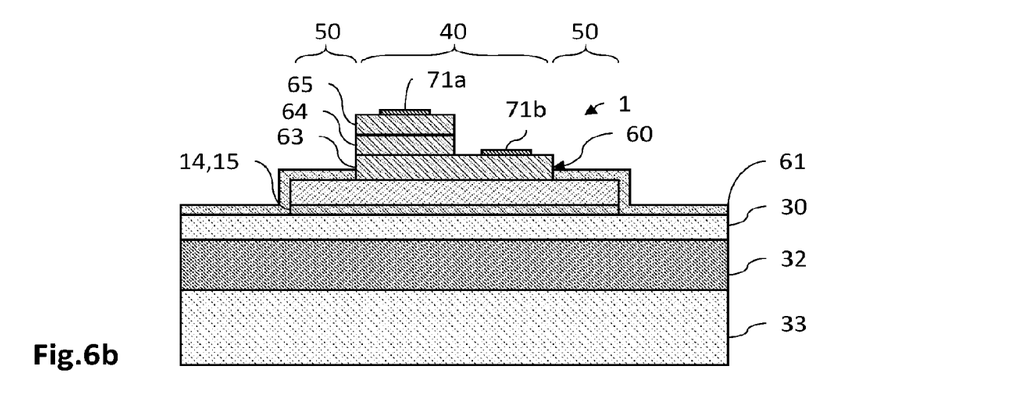

FIGS. 6a and 6b represent in a schematic manner a sectional view of two examples of an optoelectronic device with incoherent light emission such as a light-emitting diode.

In FIG. 6a, the light-emitting diode here comprises a semiconducting structure 1 obtained by the method of production according to the second embodiment, that is to say involving hydrophilic molecular bonding.

The semiconducting structure 1 comprises a semiconducting portion 60 made of epitaxied germanium-tin, here with cell matching, on a strained germination portion 40 placed under tension by tensioner arms 50. It is tied to the support layer 30 by hydrophilic molecular bonding, this being manifested by the presence of an insert material 14, 15, here a silicon oxide, situated at the interface between the germanium of the structured part 11 and the silicon of the support layer 30. The support layer 30 is here a silicon upper layer of a substrate of SOI type. It rests on an oxide layer 32 situated between the support layer 30 and a thick lower layer 33 of silicon.

The epitaxied semiconducting portion 60 comprises a PIN junction produced by implantation of dopants (phosphorus and boron, in the case of germanium-tin) so as to form an N-doped zone 63 neighboring a P-doped zone 65. Here, an intrinsic zone 64 (not intentionally doped) separates the N- and P-doped zones 63, 65. The PIN junction extends in a substantially vertical manner across the semiconducting portion, in the direction of the strained portion 40. Moreover, two pads 71a, 71b of an electrically conducting material are present at the level of the doped zones 63, 65, forming electrical contacts. The semiconducting structure 1 can comprise an encapsulation layer (not represented) which covers the strained portion 40 and the tensioner arms 50, as well as the epitaxied portion 60.

In this example, the semiconducting portion 60 has been epitaxied on the strained germination portion 40 but also on the surface of the tensioner arms 50. Insofar as the tensioner arms 50 do not exhibit the same average deformation as that of the strained portion 40, the crystallographic structure of the epitaxied portion 60 is then not homogeneous, depending on whether one considers the central zone situated facing the strained portion 40 or the lateral zones situated facing the tensioner arms 50. It is then advantageous that the PIN junction and the electrical contacts be situated at the level of the central zone of the epitaxied portion 60, thus making it possible to limit losses during electrical injection.

By way of example, the germanium-tin semiconducting portion of the diode exhibits an average thickness of 300 nm. The strained portion also exhibits an average thickness of 300 nm. It exhibits a bonded area of the order of a few square microns, for example 1 µm$^2$, and a biaxial average deformation of about 2%. The tensioner arms exhibit a bonded minimum area of the order of 305 µm$^2$. The semiconducting structure is tied by hydrophilic molecular bonding of a minimum value of 1 J/m$^2$ obtained subsequent to a consolidation annealing at a temperature of about 200° C. for a sufficient duration of a few minutes to a few hours.

The light-emitting diode can be obtained in the following manner. The semiconducting structure 1 is produced firstly by the method according to the second embodiment, and then the doped zones 63, 65 are produced by implantation of impurities, for example phosphorus and boron in the case of germanium-tin. The electrical contacts 71a, 71b are produced thereafter. An encapsulation layer is deposited thereafter and then leveled flat by a chemical mechanical polishing technique CMP and then etched locally so as to render the electrical contacts accessible.

FIG. 6b illustrates a variant of the light-emitting diode illustrated in FIG. 6a, which is distinguished therefrom essentially in that a PIN junction extends in a manner substantially parallel to the plane of the support layer.

The epitaxied semiconducting portion 60 is structured in its thickness, so as to exhibit a lower part 63 doped according to a first type of conductivity, here of type P, resting on the germination portion 40 bonded to the support layer 30. On the P-doped lower part rests an upper part 65 doped according to a second type of conductivity, here of type N. An intrinsic part 64 is situated between the N-doped upper part 65 and the P-doped lower part 63, and here exhibits dimensions in the plane (X, Y) that are substantially identical to those of the upper part 65. Thus, the P- and N-doped parts and the intrinsic part together form a PIN junction which extends in a plane substantially parallel to the plane (X, Y). Two pads 71a, 71b of an electrically conducting material, forming electrical contacts, are disposed on the N-doped upper part 65 and on a free zone of the P-doped lower part 63.

By way of example, the lower part 63 of the epitaxied portion exhibits a thickness of the order of 200 nm, and a doping level of the order of $2.10^{19}$ cm$^{-3}$. The intrinsic part 64 exhibits a thickness here of the order of 100 nm and the upper part 65 a thickness of the order of 200 nm and a doping level of the order of $2.10^{19}$ cm$^{-3}$. The lower part 63 of the epitaxied portion exhibits a bonded area of the order of a few square microns, for example 1 µm$^2$, and the strained portion 40 exhibits a biaxial average deformation of about 2%. The tensioner arms 50 exhibit a bonded area of the order of 300 µm$^2$. The semiconducting structure 1 is tied by hydrophilic molecular bonding of a minimum value of 1 J/m$^2$ obtained subsequent to a consolidation annealing at a temperature of about 200° C. for a sufficient duration of a few minutes to a few hours.

The doped parts of the epitaxied portion may have been produced during the epitaxial growth of the germanium-tin semiconducting portion. Alternatively, they can be obtained after production of the semiconducting structure by steps of implanting dopant impurities at various depths.

FIGS. 7a to 7f represent in a schematic manner in sectional view various steps of an exemplary method for producing a laser source in which the optical cavity is produced at the level of the support layer.

Figures 7A, 7B:
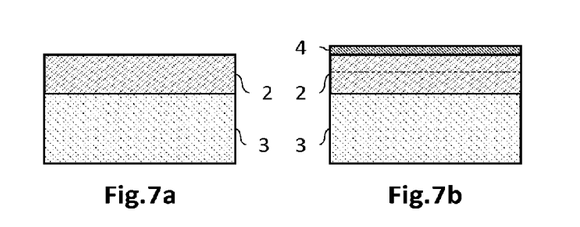
FIGS. 7a to 7f illustrate in a schematic manner and in sectional view various steps of a method for producing an optoelectronic device comprising a semiconducting portion epitaxied on a strained germination portion, the optoelectronic device here being a laser source whose optical cavity is produced at the level of the support layer.
Figure 7C:
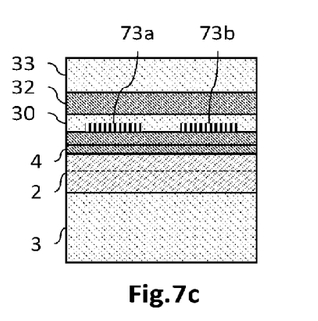
Figure 7D:
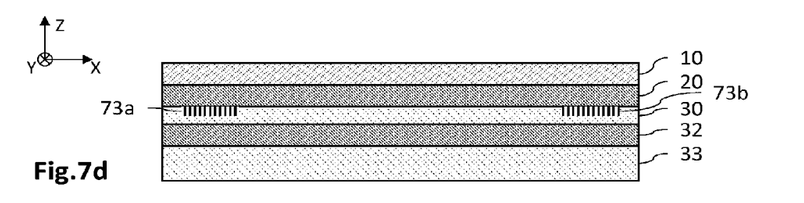
Figure 7E:
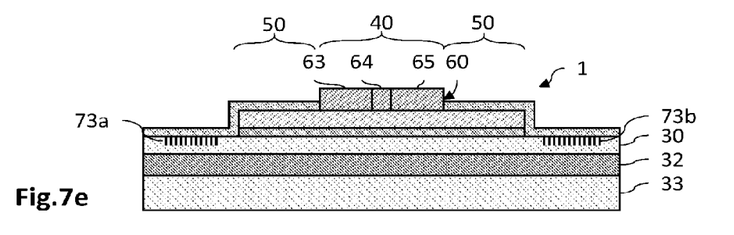
Figure 7F:
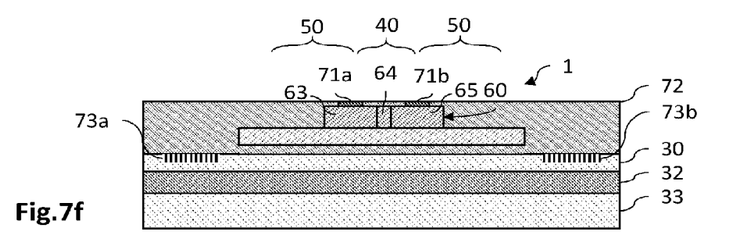

In this example, a layer 2 of a semiconducting material, here germanium, is produced, for example by RP-CVD (for Reduced Pressure Chemical Vapor Deposition) epitaxy, on a silicon substrate 3 (FIG. 7a). The germanium layer is thereafter covered with an oxide layer 4 and then H+ ions are implanted in the germanium layer (dotted line in FIG. 7b). A silicon layer is produced thereafter, intended to form the support layer 30, here in the form of an SOI substrate, in which two Bragg mirrors 73a, 73b (or equivalent optical elements) intended to form an optical cavity are produced at the level of its surface 31. The surface 31 of the support layer is thereafter covered with an oxide layer. The SOI substrate thus obtained is tied to the surface of the oxide layer 4 (FIG. 7c). The breakage of the germanium layer 2 is performed at the level of the ion implantation zone and a stack of a germanium germination layer 10 tied to a silicon support layer 30 is thus obtained by way of a silicon oxide sacrificial layer 20. The two Bragg mirrors 73a, 73b are buried in the support layer 30 at the level of the interface with the sacrificial layer 20 (FIG. 7d). A semiconducting structure 1 is thereafter obtained by epitaxial growth, here with cell matching, of a semiconducting portion on an individualized structured part 11 arising from the germination layer 10 on the basis of the method according to the second embodiment. The Bragg mirrors are situated here on either side of the semiconducting portion and form an optical cavity at the level of which the portion is placed (FIG. 7e). The Bragg mirrors 73a, 73b can thus be disposed facing or not the tensioner arms 50. Alternatively, the optical cavity can be formed by a single Bragg array situated facing the semiconducting portion while comprising a periodicity defect of the array forming a λ/4, cavity λ being the wavelength of the light beam intended to be emitted by the light source. A PIN junction is produced thereafter in the semiconducting portion, the junction comprising an N-doped part and a P-doped part, here separated from one another by an intrinsic part (not intentionally doped). The PIN junction extends here along the thickness of the semiconducting portion (FIG. 7e). Finally, electrical contacts 71a, 71b are produced respectively on the doped part 63 and the doped part 65 and an encapsulation layer 72, made for example of silicon oxide, is deposited so as to cover the semiconducting structure 1 while leaving the electrical contacts 71a, 71b accessible (FIG. 7f). Moreover, the support layer may have been previously structured in such a way as to form the core of a waveguide surrounded by a sheath formed by the silicon oxide, the core extends substantially facing the strained portion and the epitaxied semiconducting portion.

Particular embodiments have just been described. Alternative variants and various modifications will be apparent to the person skilled in the art.

Thus, the optoelectronic devices described previously are described solely by way of illustration. Other optoelectronic devices can be produced, for example laser sources with optical or electrical pumping, with or without PN, PIN junction, light-emitting diodes, or indeed photodetectors.

Moreover, as mentioned previously, the step of individualizing the structured part 11 in relation to the peripheral part 12 can be performed before or after the step of epitaxial growth of the semiconducting portion 60 on the strained germination portion 40.

Finally, in an advantageous manner, a plurality of semiconducting structures 1 can be produced in a simultaneous manner by epitaxy of distinct semiconducting portions 60 on strained germination portions 40 formed on the basis of the same germination layer 10. The semiconducting structures are then adjacent and separate from one another. Thus, each semiconducting structure is distinct from its neighbors, that is to say unattached to the corresponding peripheral part of the same germination layer.

The invention claimed is:

1. A method for forming a semiconducting portion by epitaxial growth on a strained germination portion, comprising the steps of:
   i) providing a stack, formed of a germination layer covering a sacrificial layer disposed on a support layer, said germination layer exhibiting a nonzero initial value of tensile strain;
   ii) structuring the germination layer in such a way as to form a structured part and a peripheral part, the structured part comprising a central portion linked to the peripheral part by at least two lateral portions opposite one another in relation to the central portion, the lateral portions exhibiting a greater average width than an average width of the central portion;
   iii) producing a cavity under the structured part while rendering free a surface of the support layer situated facing the structured part, the central portion, termed the strained germination portion, then being strained under tension to a final value greater than the initial value;
   iv) forming the semiconducting portion by epitaxial growth on the strained germination portion;
   in which, during step iii), the structured part is furthermore placed in contact with said free surface in such a way as to bind the structured part of said free surface.

2. The method as claimed in claim 1, furthermore comprising the steps of:
   prior to step i) of provision, estimating a final value ($\sigma_{pc}^f$) of tensile strain for which the germination layer exhibits a final lattice constant ($a_{pc}^f$) substantially equal to the so-called natural lattice constant ($a_{ps}$) of the semiconducting portion;
   determinating the structuring so that, after step iii) of producing the cavity, the strained germination portion exhibits said final value ($\sigma_{pc}^f$) of tensile strain, and therefore a lattice constant ($a_{pc}^f$) substantially equal to the natural lattice constant ($a_{ps}$) of the semiconducting portion, so that, during step iv), the semiconducting portion is epitaxied in a substantially relaxed manner.

3. The method as claimed in claim 2, in which, during the determination step, the average width of the lateral portions and the average width of the central portion are chosen so that the central portion exhibits, during the step of producing the cavity, said final value ($\sigma_{pc}^f$) of tensile strain.

4. The method as claimed in claim 1, in which step iv) comprises a prior sub-step in which a growth mask is deposited on the structured part so as to cover the lateral portions and to render free a surface of the central germination portion, termed the germination surface, the semiconducting portion being formed on the basis of the germination surface.

5. The method as claimed in claim 1, in which, subsequent to step iii), the structured part is tied to the free surface of the support layer by molecular bonding, and in which the following sub-steps are performed:
   a) determining a minimum value of molecular bonding energy of the structured part on the support layer, together with a minimum value of bonded area of the lateral portions on the support layer, these minimum values being such that said molecular bonding energy is greater than an elastic energy of the structured part;
   b) after step iii) or iv), performing a consolidation annealing at an annealing temperature such that the molecular bonding energy exhibits a value greater than or equal to said previously determined minimum value; and then
   c) etching a distal part of the lateral portions in relation to the strained germination portion, so that the bonded area of the lateral portions exhibits a value greater than or equal to said previously determined minimum value.

6. The method as claimed in claim 5, in which step c) of etching is carried out after step iv) of epitaxial growth in the course of which the consolidation annealing step b) is performed.

7. The method as claimed in claim 5, in which, during step c), a distal part of the lateral portions joining with the peripheral part of the germination layer is etched.

8. The method as claimed in claim 7, in which, subsequent to step c), the structured part exhibits a substantially plane upper face opposite to the support layer.

9. The method as claimed in claim 5, in which, during step iii), the cavity is produced and contacting by HF vapor-phase etching is carried out optionally followed by the deposition and then the evaporation of a liquid at the level of the cavity, and in which, during step b) the annealing temperature is greater than or equal to 200° C.

10. The method as claimed in claim 5, in which, during step iii), an oxidation or a nitriding of said free surface and of a surface of the structured part oriented toward the free surface is carried out, and in which, during step b) the annealing temperature is greater than or equal to 100° C.

11. The method as claimed in claim 10, in which, subsequent to step iii), a dielectric layer, arising from said oxidation or nitriding carried out, is formed at the interface between the structured part and the support layer, which exhibits a thickness of greater than or equal to 10 nm.

12. The method as claimed in claim 1, in which, during step ii), the structuring of the lateral portions is carried out so that, during step iii), the strained germination portion exhibits a uniaxial or biaxial deformation.

13. The method as claimed in claim 1, in which the epitaxied semiconducting portion comprises at least one doped part with a doping level of greater than or equal to $2.10^{18}$ cm$^{-3}$.

14. A method for producing an optoelectronic device comprising a semiconducting portion obtained by the method as claimed in claim 1, in which a PN or PIN junction is produced in the semiconducting portion, the junction extending in a manner substantially orthogonal or parallel to the plane of the support layer.

15. A method for producing an optoelectronic device comprising a semiconducting portion obtained by the method as claimed in claim 1, in which an optical cavity is produced in which is situated the semiconducting portion whose material is suitable for forming a gain medium, the device obtained being suitable for emitting a coherent light beam.

* * * * *